United States Patent [19]

Liou

[11] Patent Number: 4,583,226

[45] Date of Patent: Apr. 15, 1986

[54] COUPLED CAVITY INJECTION LASER

[75] Inventor: Kang Liou, Wescoesville, Pa.

[73] Assignee: AT&T Bell Laboratories, Murray Hill, N.J.

[21] Appl. No.: 518,127

[22] Filed: Jul. 28, 1983

[51] Int. Cl.$^4$ .......................... H01S 3/098; H01S 3/10
[52] U.S. Cl. ....................................... 372/19; 372/32; 372/92; 372/97
[58] Field of Search .................. 372/19, 44, 50, 92, 372/97, 98, 101, 108, 32; 350/96.15; 357/19

[56] References Cited

U.S. PATENT DOCUMENTS

| | | | |
|---|---|---|---|
| 3,803,511 | 4/1974 | Thompson | 372/94 |
| 4,278,322 | 7/1981 | Mahlein | 350/96.15 |
| 4,358,851 | 11/1982 | Scitres et al. | 372/97 |
| 4,485,474 | 11/1984 | Osterwalder | 372/50 |
| 4,504,950 | 3/1985 | AuYeung | 372/97 |
| 4,528,670 | 7/1985 | Burrus, Jr. et al. | 372/44 |

OTHER PUBLICATIONS

S. Akiba et al., "High Rate Pulse Generation from In-GaAsP Laser in SELFOC Lens External Resonator", *Electronics Letters*, Jul. 23rd, 1981, vol. 17, No. 15, pp. 527-529.
"Self-Focusing Lens as Resonator Enables 10-GHz Modulation", *Fiberoptic Technology*, Oct. 1981, p. 124.
"Discrimination Against Unwanted Orders in the Fabry-Perot Resonator", *The Bell System Technical Journal*, 1962, pp. 453-462.
"Mode Selection in Lasers", *Proceedings of the IEEE*, Apr. 1972, vol. 60, No. 4, pp. 422-440.
"Simple System for Broad-Band Single-Mode Tuning of D.H. GaAlAs Lasers", *Electronic Letters*, vol. 15, No. 3, pp. 73-74, Feb. 1979.
"External Cavity Controlled Single Longitudinal Mode Laser Transmitter Module", *Electronic Letters*, Nov. 1981, vol. 17, No. 24, p. 931.
"CW and High-Speed Single-Longitudinal-Mode Operation of a Short InGaAsP Injection Laser with External Coupled Cavity", Paper PD #5, Topical Meeting on Optical Fiber-Communications, New Orleans, Feb. 28-Mar. 2, 1983.
"Monolithic Two-Section GaInAsP/InP Active-Optical Resonator Devices Formed by Reactive Ion Etching", *Applied Physics Letters*, Mar. 1981, vol. 38, pp. 315-317.
"Single-Mode Operation of Coupled-Cavity GaInAsP-/InP Semiconductor Lasers", *Applied Physics Letters*, Jan. 1983, vol. 42, pp. 6-8.
"Short-Cavity Single-Mode 1.3 $\mu$m InGaAsP Lasers with Evaporated High-Reflectivity Mirrors", *Electronic Letters*, vol. 17, No. 25, 1981, pp. 954-956.
"Short-Cavity InGaAsP Injection Lasers: Dependence of Mode Spectra and Single-Longitudinal-Mode Power on Cavity Length", *IEEE Journal of Quantum Electronics*, Jul., 1982, vol. QE-18, No. 7, pp. 1101-1112.
"Very-High-Speed Back-Illuminated InGaAs/InP Pin Punch-Through Photodiodes", *Electronic Letters*, vol. 17, No. 12, 1981, pp. 431-432.
Paper No. 954, National Convention of the Institute of Electronics and Communication Engineers of Japan (IECEJ), Sendai, Japan, Apr. 2-4, 1983.

*Primary Examiner*—James W. Davie
*Attorney, Agent, or Firm*—Peter V. D. Wilde

[57] ABSTRACT

Described is an internally mode stabilized injection laser. Stabilization is obtained in a coupled cavity structure where one cavity is passive. The passive cavity is a high efficiency waveguide with dimensions chosen to suppress unwanted modes.

3 Claims, 5 Drawing Figures

FIG. 4
FIG. 4A
LASER ALONE
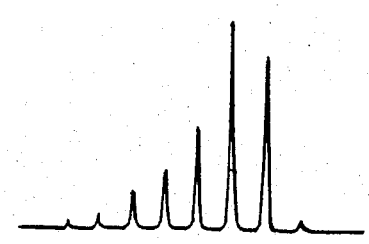
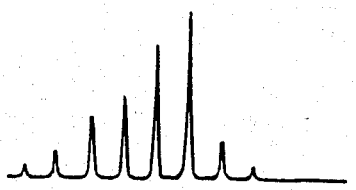
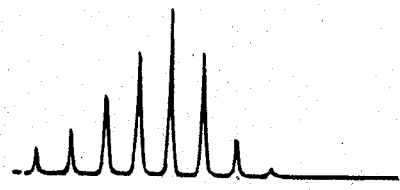
λ(nm)
FIG. 4B
GRINROD CAVITY COUPLED LASER
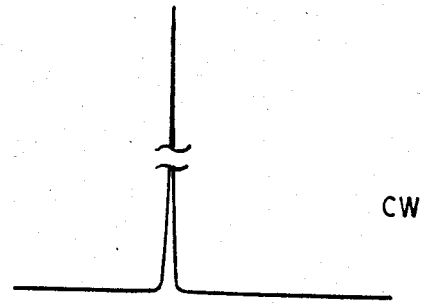
CW
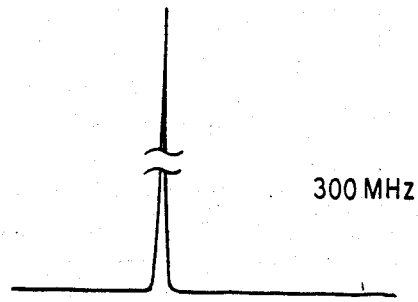
300 MHz
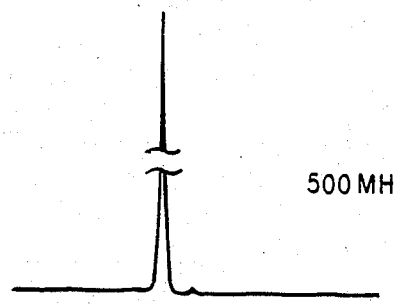
500 MHz
λ(nm)

COUPLED CAVITY INJECTION LASER

BACKGROUND OF THE INVENTION

Single frequency laser sources are of great interest for high bandwidth single-mode fiber communication systems when the data bit rate is limited by chromatic dispersion. High speed light output pulses can be generated by either direct modulation of the laser or continuous wave operation of the laser with an external modulator.

Longitudinal mode selection by a coupled cavity has been investigated as an approach to achieve single-longitudinal-mode operation of semiconductor lasers. (See D. A. Kleinman and P. P. Kisliuk, The Bell System Technical Journal, Volume 41, p. 453, March, 1962 and P. W. Smith, Proceedings of the IEEE, Volume 60, No. 4, p. 422, April, 1972.) The second cavity optically coupled to the laser can be either an air-spaced passive cavity or a laser cavity with bias-current control. (D. Renner and J. E. Carroll, Electronics Letters, Volume 15, No. 3, p. 73, Feb. 1979; C. Lin and C. A. Burrus, Post Deadline Paper No. PD5-1, Topical Meeting on Optical Fiber Communication, New Orleans, Feb. 28—Mar. 2, 1983; L. A. Coldren, B. I. Miller, K. Iga, and J. A. Rentschler, Applied Physics Letters, Volume 38, p. 315, Mar., 1981; and K. J. Ebeling, L. A. Coldren, B. I. Miller, and J. A. Rentschler, Applied Physics Letters, Volume 42, p. 6, Jan., 1983). A long laser cavity and a shorter second passive, or active, cavity are used in such a coupled cavity geometry. The undulation of the laser net gain spectrum in this compound resonator provides suppression of the unwanted laser longitudinal modes. The passive-active coupled cavity laser is attractive for its simplicity. The passive external cavity can be applied to existing lasers with certified designs. Use of a concave spherical mirror has been suggested by Preston et al to focus light to the laser for single mode operation. (See K. R. Preston, K. C. Woollard, and K. H. Cameron, Electronics Letters, Volume 17, No. 24, p. 931, Nov., 1981). However, manufacturing and alignment of the spherical mirror is difficult. A coupled planar Au mirror was shown by Lin et al to stabilize single-longitudinal-mode operation under high speed pulse modulation of a short cavity laser. (See C. A. Burrus, T. P. Lee, and A. G. Dentai, Electronics Letters, Volume 17, No. 25, p. 954, 1981 and T. P. Lee, C. A. Burrus, J. A. Copeland, A. G. Dentai, and D. Marcuse, IEEE Journal of Quantum Electronics, Volume QE-18, No. 7, July, 1982).

A short cavity laser, however, has been shown to have a short practical operation life time. (See K. Endo, S. Matsumoto, H. Kawano, T. Furuse, and I. Sakuma, Paper No. 954, National Convention of the Institute of Electronics and Communication Engineers of Japan (IECEJ), Sendai, Japan, April 2–4, 1983). A longer laser cannot be used with the flat mirror because of the poor optical coupling efficiency.

STATEMENT OF THE INVENTION

For multi-longitudinal-mode lasers, an optimized coupling efficiency between the active laser and the tuning cavity is required for reliable single-mode operation under high speed pulsed as well as continuous-wave operation. This is achieved according to the invention by coupling to the laser a passive graded index lens stabilizer cavity. The passive cavity is terminated with a highly reflective surface. The passive cavity may be attached or in close proximity to the injection laser. The passive cavity waveguide has an optical length that is less than the corresponding optical length of the active laser cavity. This insures stable suppression of unwanted longitudinal modes. Preferably the coupled graded index cavity has a length slightly less than a quarter pitch of the light path such that the reflected light is focused at the front face of the laser.

DETAILED DESCRIPTION

FIG. 4 is a diagram showing continuous wave and square wave pulsed spectra for the laser alone 4(a) and for the coupled cavity arrangement of the invention 4(b).

Figure 1:
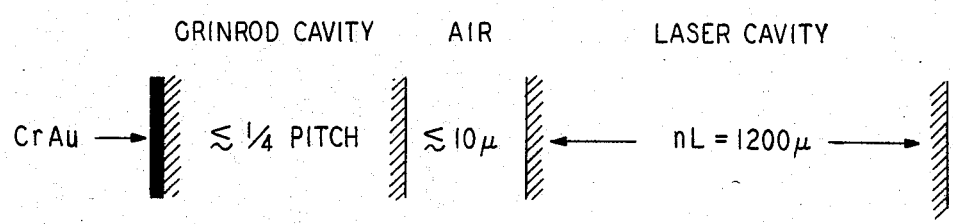
FIG. 1 is a schematic representation of the passive-to-active coupled cavity laser of the invention.

The principles on which the invention is based are illustrated by FIG. 1. The active laser cavity is shown in close proximity to the passive graded index cavity. An air space of $10\mu$ is shown between the active and passive cavities. Alternatively, the two cavities may be butted, or even joined together with epoxy or the like. If separated as shown it is preferred that they be close e.g. within $50\mu$, and preferably within $10\mu$, to maximize coupling. This spacing will affect power output more than mode purity so it is a design tradeoff depending on the power needed. There is however a point where losses become so large that insufficient power is coupled back into the active resonant cavity to effect mode selection. The front end of the graded index cavity facing the laser can be antireflection coated in case reflection from that surface affects mode stability.

Figure 2:
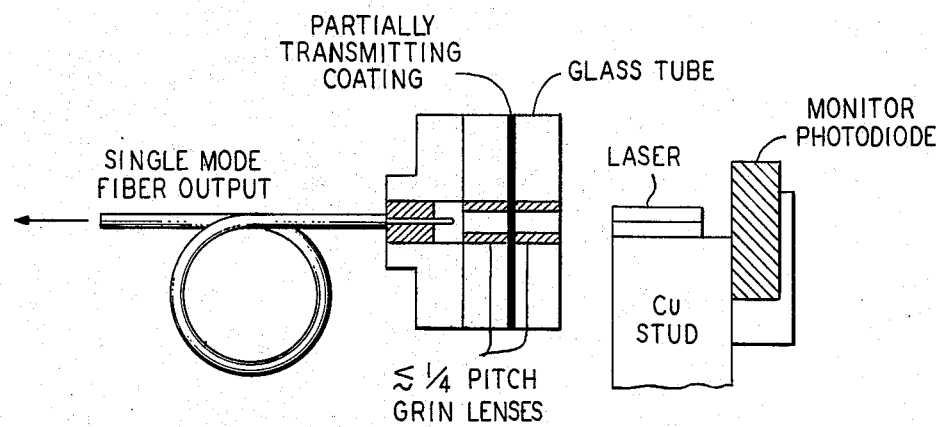
FIG. 2 is a diagram of a first embodiment of the invention.
Figure 3:
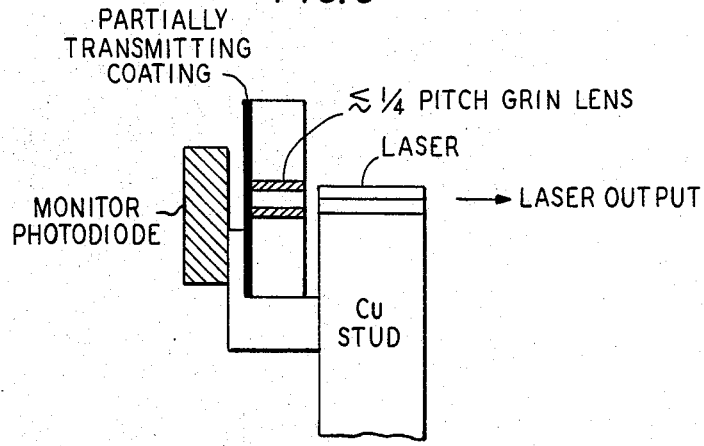
FIG. 3 is a diagram of another embodiment of the invention.

Referring again to FIG. 1, the passive graded index cavity is bounded by a totally or partially reflecting mirror. The reflectivity of the mirror depends on the amount, if any, of radiation desired from that end of the coupled cavity assembly. The device can be designed for output coupled to a transmission fiber through the mirror as shown in FIG. 2, in which case the mirror will be designed to pass the amount of light output. Also it can be designed with a power (or even a spectral) monitor at the other facet of the active cavity as shown. FIG. 3 shows an alternative arrangement with the output radiation taken from the active cavity of the device. The monitor is optically coupled to the partially transmission mirror.

The coupled-cavity laser of this invention was demonstrated in the following way.

GRINROD cavities with a short length compared to the laser cavity length were prepared from graded index multimode fiber. The fiber was epoxied inside a glass capillary tube, and was polished from both ends to a predetermined length. One end was then coated with Cr and Au for high reflectivity. The coated end was then epoxied on a glass rod for handling. The coupling geometry of the GRINROD cavity to the laser was as shown in FIG. 1. The mode spacing of the InGaAsP BH laser is 7Å, from which the effective cavity length in air is $1200\mu m$. The air gap between the GRINROD cavity and the laser facet was $\lesssim 10\mu m$. This air spaced cavity did not contribute to the mode selection effect due to its large cavity mode spacing $\gtrsim 120\times$laser mode spacing).

The graded index fiber used for the GRINROD cavity had a 0.29 numerical aperture and 70μm core diameter. The length of the GRINROD cavity was 170μm which was made shorter than a quarter pitch to have a focal point in air. This results in nearly a 4:1 ratio of the external cavity mode spacing to the laser mode spacing. A ratio chosen between 3:1 and 6:1 would be appropriate. By employing the coupled cavity approach described here it is also appropriate to use shorter active laser cavities than one might otherwise find expedient from the standpoint of laser lifetime.

The 6mW/facet continuous wave spectrum for the InGaAsP BH laser biased at 51mA ($I_{th}=23$mA) at 23 degrees C. is shown in FIG. 4(a). A maximum of 40% increase in light output was observed when the GRINROD cavity was coupled to the laser. The corresponding 6 mW continuous wave single-longitudinal-mode spectrum at the same heat sink temperature is shown in FIG. 4(b). The laser with the coupled external cavity was pulsed by a square wave generator from threshold to 6mW. A beam splitter was used for simultaneous measurements of the spectrum and the light output pulses detected with a high speed InGaAs/InP PIN photodiode. (See T. P. Lee, C. A. Burrus, K. Ogawa, and A. G. Dentai, Electronics Letters, Volume 17, No. 12, p. 431, 1981). The on/off extinction ratio was better than 30:1. The spectra of the GRINROD external cavity laser under 300 MHz and 500 MHz square wave modulation are also shown in FIG. 4(b). The corresponding multimoded spectra for the laser alone are shown in FIG. 4(a). The same longitudinal mode was stabilized with the external cavity as the modulation rate was varied. The most significant side mode intensity relative to the main mode intensity was suppressed by 23 dB and 20 dB respectively at 300 MHz and 500 MHz. Under continuous wave operation the side mode suppression ratio was better than 25 dB. When the laser was pulsed from above $I_{th}$, the amplitude of the first relaxation oscillation peak decreased and the mode suppression ratio approached that under continuous wave operation with the penalty of a decreased on/off light output extinction ratio.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Laser device comprising
an injection laser and a coupled cavity means situated adjacent the injection laser for influencing the mode structure of the output of the injection laser the invention characterized in that said coupled cavity means comprises a graded index lens with its axis aligned to the output axis of the injection laser, and a reflecting coating on a surface of the graded index lens so that light emerging from the injection laser traverses an optical path through the graded index lens and onto said reflective coating the invention further characterized in that the length of the optical path through the coupled cavity is less than the length of the optical path in the injection laser.

2. The device of claim 1 in which the graded index lens is a short length of glass fiber waveguide.

3. The device of claim 1 in which the length of the optical path one way through the coupled cavity is slightly less than ¼ pitch.

* * * * *